United States Patent [19]
Nardi

[11] Patent Number: 5,341,110
[45] Date of Patent: Aug. 23, 1994

[54] LOW PHASE NOISE REFERENCE OSCILLATOR

[75] Inventor: Benedict J. Nardi, Thurmont, Md.

[73] Assignee: Watkins-Johnson Company, Palo Alto, Calif.

[21] Appl. No.: 91,615

[22] Filed: Jul. 14, 1993

[51] Int. Cl.$^5$ .................. H03L 7/08; H03L 7/081; H03L 7/093; H03L 7/20

[52] U.S. Cl. .................. 331/17; 331/1 A; 331/25; 331/34

[58] Field of Search .................. 331/10, 17, 20, 23, 331/34, 107 A, 108 B, 177 R, 1 A, 25, 14, 16

[56] References Cited

U.S. PATENT DOCUMENTS

| | | | |
|---|---|---|---|
| 4,325,032 | 4/1982 | Gilden | 331/107 A X |
| 4,862,104 | 8/1989 | Muratani et al. | 331/17 X |
| 4,987,386 | 1/1991 | Poklemba et al. | 331/10 |

OTHER PUBLICATIONS

"Ultrahigh Speed Phase/Frequency Discriminator" (AD 9901), Communications Products (pp. 4–115 to 4–121), no author, not dated; Product Specifications.
F. M. Gardner, Phaselock Techniques, 2nd ed., John Wiley and Sons, New York, 1979 (pp. 8 and 9), "Loop Fundamentals".
Section VIII, Analog Devices, Inc., "Frequency Domain Functions: Phase Locked Loops"; pp. VIII-1 to VIII-20, no author, not dated; Use of AD 9901.

*Primary Examiner*—David Mis
*Attorney, Agent, or Firm*—Flehr, Hohbach, Test, Albritton & Herbert

[57] ABSTRACT

A phase-locking oscillator circuit having improved phase noise characteristics is disclosed herein. The oscillator circuit includes a tuned oscillator for providing a carrier signal at a tunable carrier frequency. The carrier signal is applied to an input port of a phase modulator operative to impress an RF signal upon output terminal. An error detection and feedback network generates an error signal by comparing a predefined characteristic of the RF output signal to a reference signal. The network includes a loop filter arrangement which operates upon the error signal so as to provide a tuned oscillator tuning signal to a tuning port of the tuned oscillator and a modulator control signal to a control port of the phase modulator. In an exemplary implementation the error detection and feedback network includes a phase detector for generating the error signal in response to the phase difference between the RF output signal and the reference signal.

15 Claims, 7 Drawing Sheets

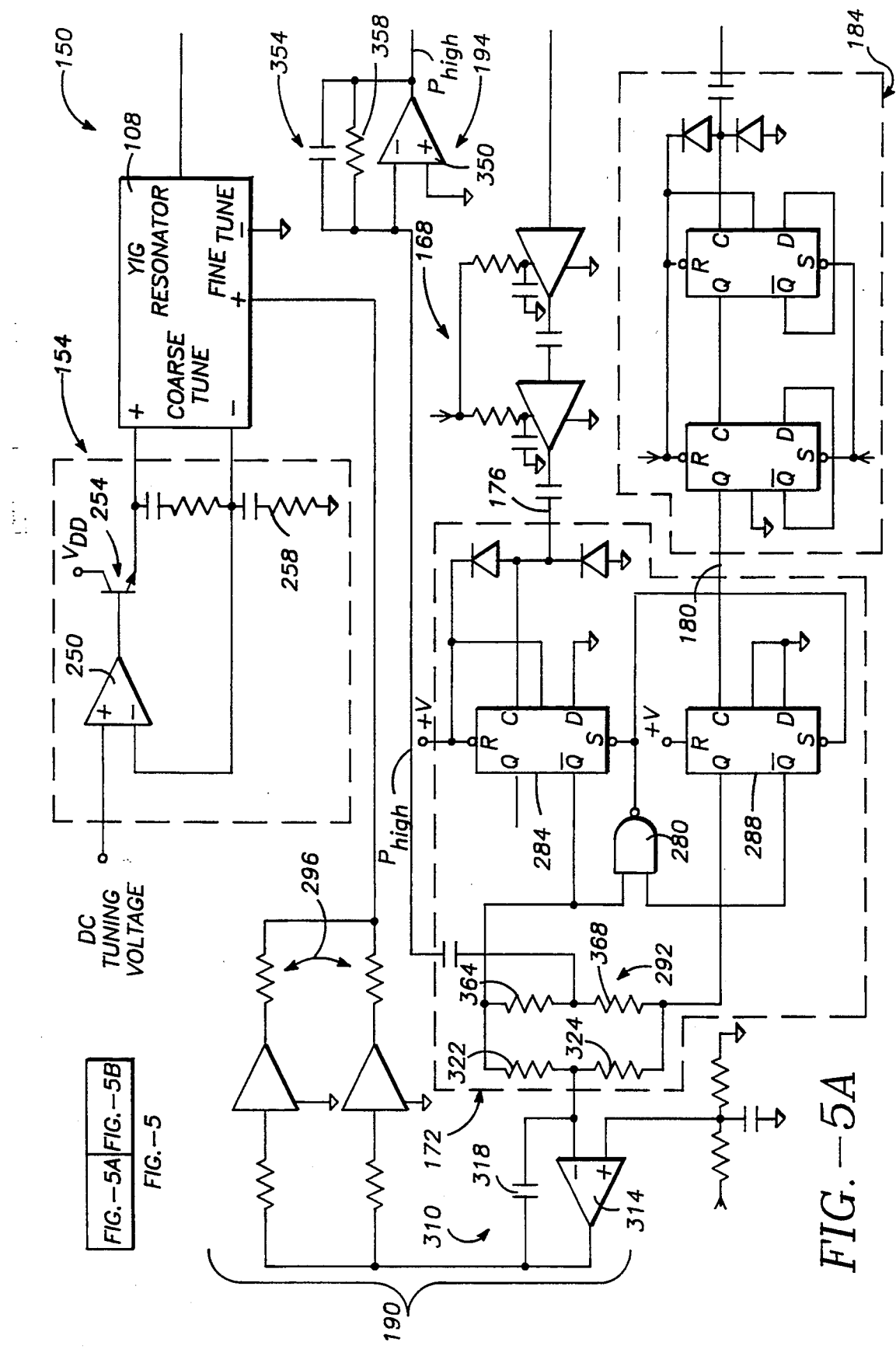
FIG.—5A

LOW PHASE NOISE REFERENCE OSCILLATOR

FIELD OF THE INVENTION

This invention relates generally to frequency synthesizers and, more particularly, to a technique for reducing the phase noise generated by the oscillator circuits included within such synthesizers.

BACKGROUND OF THE INVENTION

Frequency synthesizers have been used to provide high-frequency signals within, for example, various types of communications equipment and measurement instrumentation. As is well known, at microwave frequencies and above the phase noise generated by reference oscillators included within such synthesizers can significantly degrade the spectral purity of the high-frequency output signal. Phase noise, i.e., frequency jitter, corresponds to the noise power generated by the synthesizer at frequencies other than the desired output frequency.

Oscillator circuits which include low phase noise (YIG) oscillators are often incorporated in microwave frequency synthesizers. The desirable phase noise characteristics of YIG tuned oscillators arise as a consequence of incorporation therein of YIG resonators, i.e., tuned oscillators, having high quality factors (Q). In order to further improve the phase noise performance of a particular YIG tuned oscillator, it may be phase-locked to a stable reference source as shown in FIG. 1.

Referring to FIG. 1, there is shown a block diagram of a conventional YIG tuned oscillator circuit 10 designed to phase lock a YIG tuned oscillator 14 to a stable reference oscillator 18. The output frequency of the reference oscillator 18 may be made to match the frequency to which the tuned oscillator 10 is tuned by, for example, translating the frequency of the stable reference source using a mixer (not shown). A portion of the RF output signal generated by the YIG tuned oscillator 14 is provided to a phase detector 26 by an RF coupler 28. The oscillation frequency of the YIG tuned oscillator 14 is controlled by externally adjusting the DC voltage applied to the coarse tuning input of the YIG tuned oscillator 14, and is further stabilized in accordance with a fine-tuning signal derived from a loop filter 32. As is indicated by FIG. 1, the loop filter 32 is connected between the output of the phase detector 26 and a fine-tune port of the YIG tuned oscillator 14.

FIG. 2 graphically represents the phase noise, as measured in decibels relative to the carder signal (dBc), of the reference oscillator 18 and of the YIG tuned oscillator 14. In the representation of FIG. 2 phase noise is plotted as a function of frequency offset from the carrier frequency to which the YIG tuned oscillator 10 is tuned. As is apparent upon inspection of FIG. 2, the phase noise induced within the tuned oscillator 10 by the reference oscillator 18 (dotted line) is less than the phase noise of the free-running YIG tuned oscillator 14 (dashed line) for frequencies up to a crossover frequency of about $10^7$ radians/second ($\approx 1.59$ MHz) relative to the carrier frequency. By selecting the low-pass cutoff frequency of the loop filter 22 to be approximately equal to the crossover frequency, the overall phase noise of the tuned oscillator 10 (solid line) is made to be dominated by the reference 18 at frequencies less than the crossover frequency. At frequencies in excess of the crossover frequency, i.e., at those frequencies outside of the bandwidth of the phase-locked loop, the overall phase noise is determined by the YIG tuned oscillator 14.

As the phase noise performance of reference oscillators has continued to improve, the associated crossover frequencies at which the phase noise engendered thereby becomes dominant has correspondingly increased. In order to exploit such enhanced oscillator phase noise characteristics it is necessary that the phase-locked loop bandwidth be capable of being extended to such higher crossover frequencies. Unfortunately, signal loss induced by the magnetic core material of inductive coils used in tuning YIG resonators has tended to limit maximum loop bandwidth. Even when "fine tune" coils are utilized in resonator tuning it has proven difficult to attain loop bandwidths in excess of several hundred kHz, since such coils tend to cause phase lock loop instability by inducing excessive phase shift. Methods of resonator tuning not relying upon inductive coils (e.g., those using varactor diodes), have tended to degrade phase noise performance by inducing non-linear tuning characteristics or by lowering the oscillator Q.

OBJECTS OF THE INVENTION

Accordingly, it is an object of the present invention to provide a phase-locking oscillator circuit operative over a loop bandwidth sufficiently wide to accommodate reference oscillators having improved high-frequency phase noise characteristics.

It is a further object of the present invention to provide a technique by which the loop bandwidth of existing oscillator circuits may be increased without extensive circuit modification.

Another object of the present invention is to employ a phase modulator in conjunction with a resonator in order to realize a phase-locking oscillator circuit having a loop bandwidth broader than that of existing oscillator circuits.

SUMMARY OF THE INVENTION

In summary, the present invention comprises a phase-locking oscillator circuit having improved phase noise characteristics. The oscillator circuit includes a tuned oscillator for providing a carrier signal at a tunable carrier frequency. The carrier signal is applied to an input port of a phase modulator operative to impress an RF signal upon an output terminal. An error detection and feedback network generates an error signal by comparing a predefined characteristic of the RF output signal to a reference signal. The network includes a loop filter arrangement which operates upon the error signal in order to provide a tuned oscillator tuning signal to a tuning port of the tuned oscillator and a modulator control signal to a control port of the phase modulator.

In an exemplary implementation the error detection and feedback network includes a phase detector for generating the error signal in accordance with the phase difference between the RF output signal and the reference signal.

BRIEF DESCRIPTION OF THE DRAWINGS

Additional objects and features of the invention will be more readily apparent from the following detailed description and appended claims when taken in conjunction with the drawings, in which:

DETAILED DESCRIPTION OF THE PREFERRED EMBODIMENT

Figure 1:
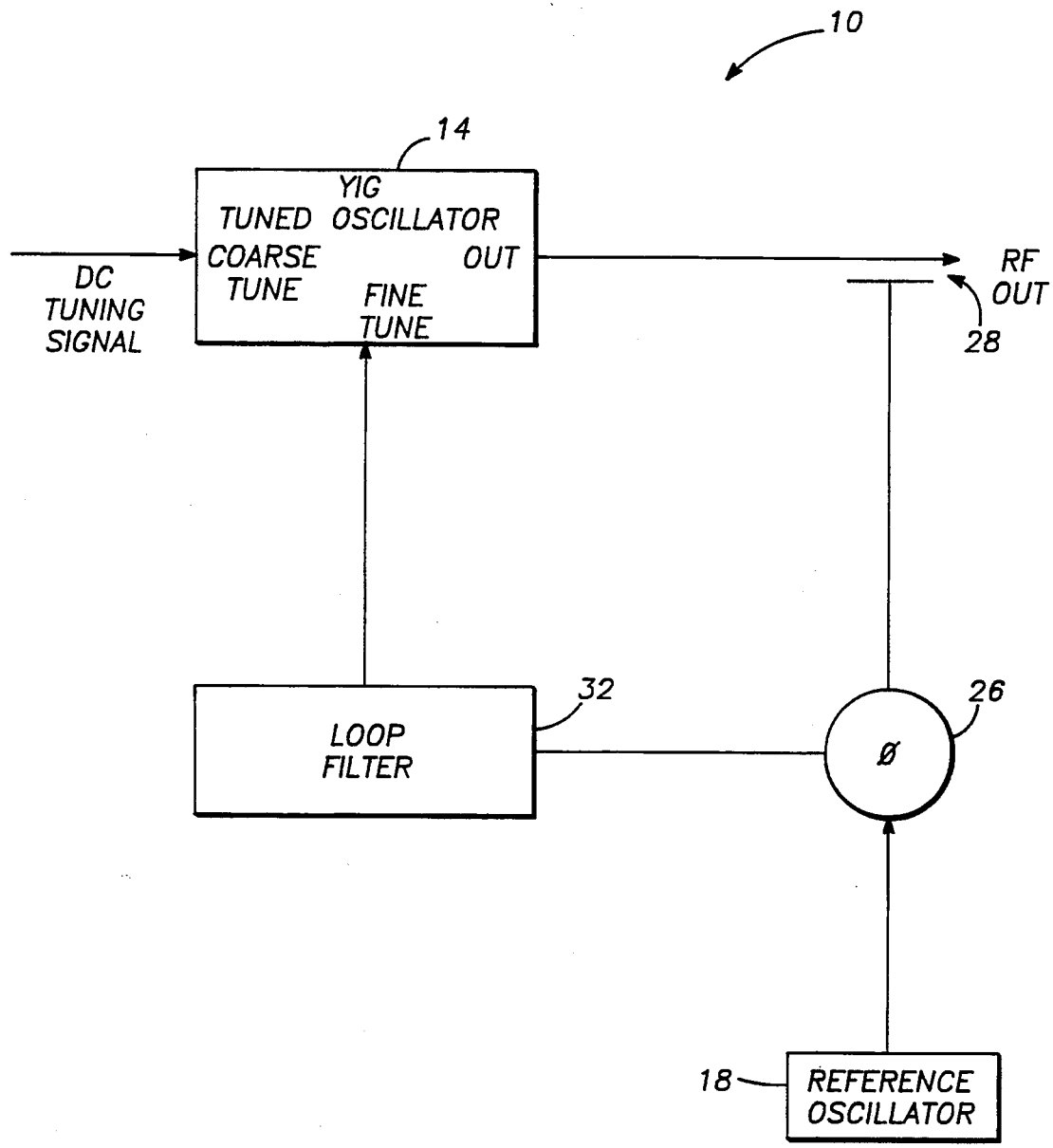
FIG. 1 shows a block diagram of a conventional YIG tuned oscillator circuit designed to phase lock a YIG tuned oscillator to a reference oscillator.
Figure 2:
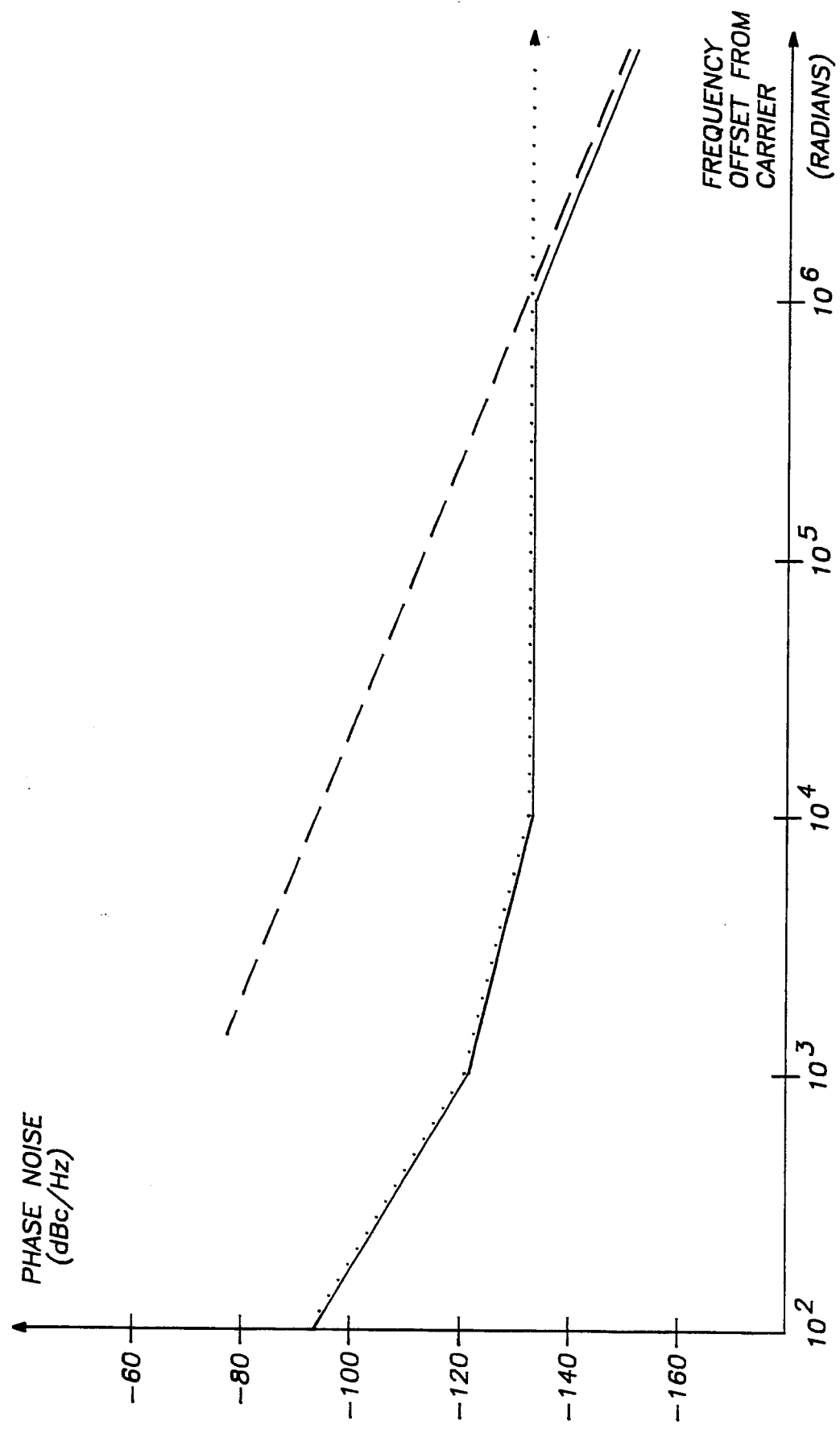
FIG. 2 graphically represents the phase noise arising within a conventional YIG oscillator circuit due to a free-running YIG tuned oscillator and a reference oscillator.
Figure 3:
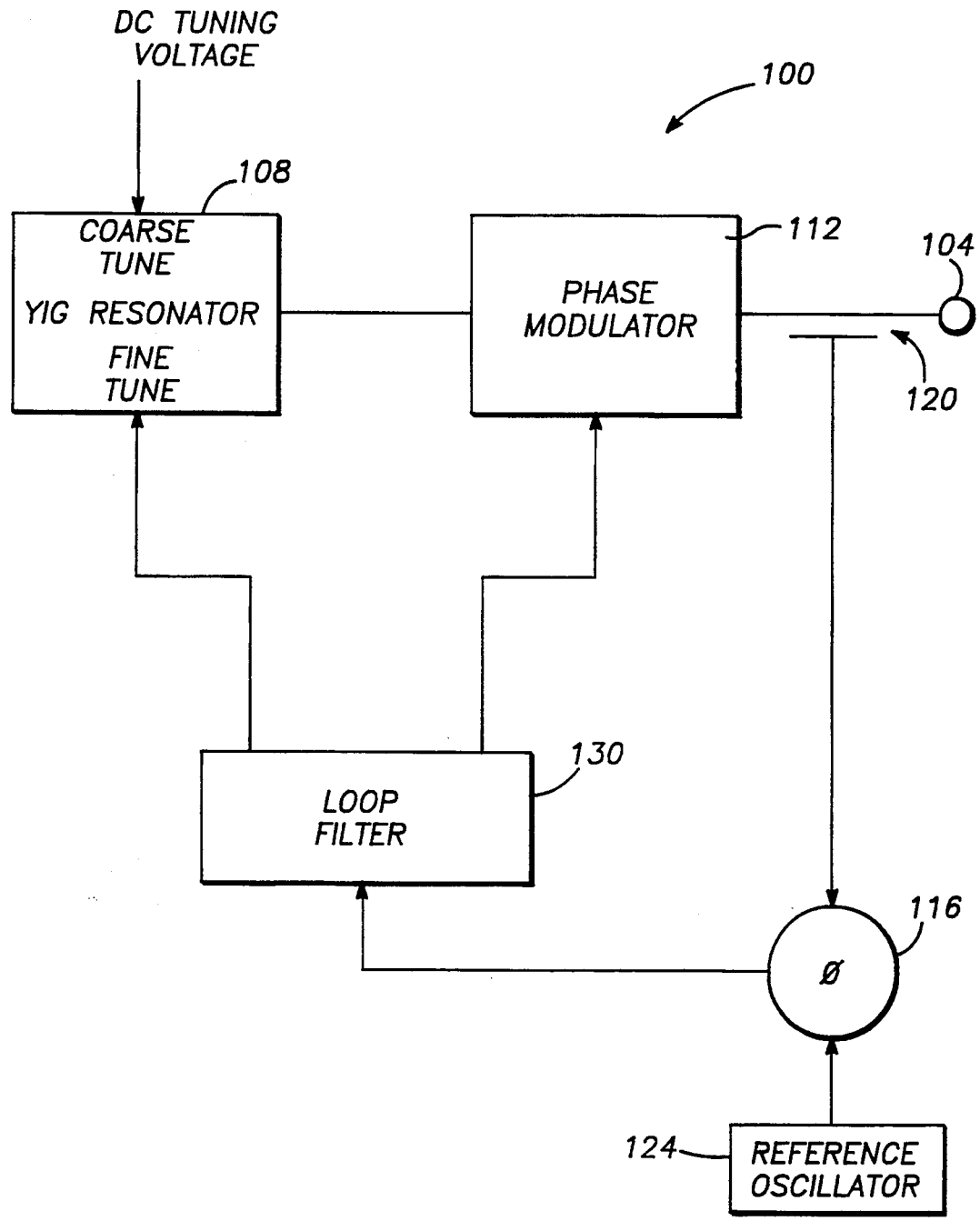
FIG. 3 is a simplified block diagram representation of a preferred embodiment of the phase-locking oscillator circuit of the present invention.

Attention is now directed to a simplified block diagram representation of the preferred embodiment of the phase-locking oscillator circuit 100 of the present invention shown in FIG. 3, since FIGS. 1 and 2 have been previously discussed. The oscillator circuit 100 is disposed to generate a high-frequency RF output signal at output terminal 104, the frequency of which may be controlled in accordance with an external DC tuning voltage. The DC tuning voltage, applied to a coarse tune input of a YIG tuned oscillator 108, determines the frequency of an RF carrier signal applied to the RF input port of a phase modulator 112. A portion of the RF output signal generated by the phase modulator 112 is coupled to a frequency or phase comparator 116 through a 10 dB directional coupler 120. The phase detector 116 operates to generate an error signal based on either the frequency or phase difference between the RF output signal and a reference signal provided by a reference oscillator 124.

Referring to FIG. 3, the error signal is supplied to a loop filter circuit 130 connected in a feedback loop configuration between the YIG tuned oscillator 108, phase modulator 112 and phase comparator 116. The error signal is filtered by the loop filter circuit 130 so as to provide a frequency fine tune signal to the magnetic tuning coil (not shown) of YIG tuned oscillator 108. Loop filter circuit 130 also furnishes a modulation control signal to the phase modulator 112. In accordance with the invention, the phase modulator 112 advantageously allows the loop bandwidth of the circuit 100 to be extended to nearly any crossover frequency at which the phase noise engendered by the reference oscillator 124 begins to exceed the phase noise generated by the YIG tuned oscillator 108. As employed herein the term "loop bandwidth" refers to the phase noise frequency at which the composite gain of the phase locked loop oscillator circuit 100 becomes approximately equal to unity, i.e., to 0 db.

The phase modulator 112 is implemented so as to be capable of responding to phase error signals at frequencies in excess of those at which the reference oscillator 124 generates appreciable phase noise. This allows the oscillator circuit 100 to be designed for improved phase noise performance, since the loop bandwidth thereof may be made sufficiently wide to accommodate reference oscillators having desirable high-frequency phase noise characteristics.

Figure 4:
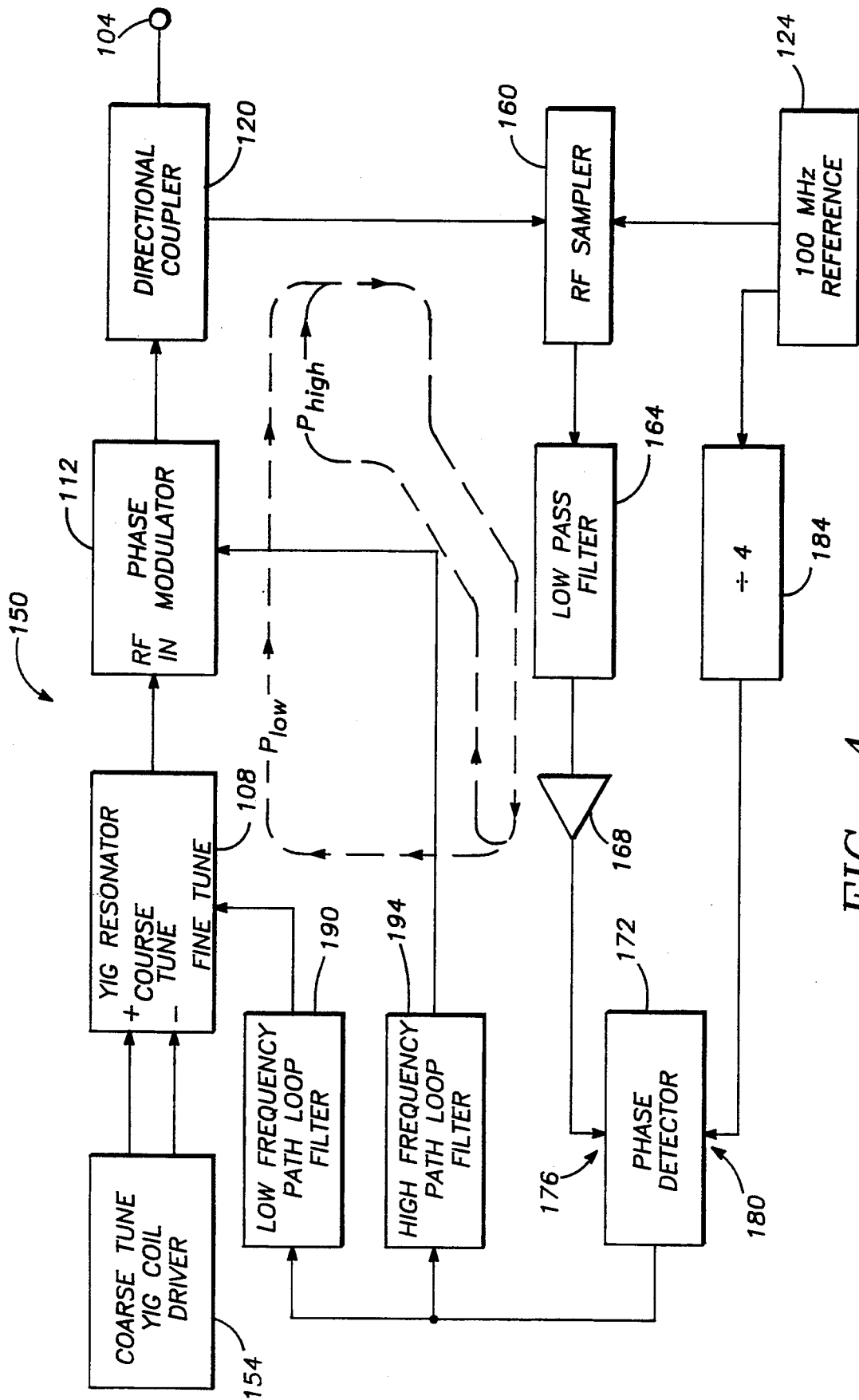
FIG. 4 is a more detailed block diagram of a preferred embodiment of the inventive oscillator circuit.

Turning now to FIG. 4, there is shown a more detailed block diagram of the preferred embodiment of the oscillator circuit 150 designed to produce a continuous wave RF output signal at a selected frequency within the range extending from 2.025 to 3.025 GHz. The permissible output frequencies are spaced at 100 MHz intervals over this range, with a particular output frequency being selected by appropriately setting the DC tuning voltage supplied to a coarse-tune YIG coil driver 154. The YIG coil driver will generally include a buffer comparator for receiving the DC tuning voltage, as well as a transistor driver for energizing the coarse tuning coil (not shown) of the YIG tuned oscillator 108. The YIG tuned oscillator 108 supplies a continuous wave RF signal to the phase modulator 112 at a frequency of either 2.025, 2.125, 2.25, . . . , or 3.0 GHz, determined in accordance with the value of the DC tuning voltage.

As shown in FIG. 4, the oscillator circuit 150 includes an RF sampler 160, to which is coupled a sample portion of the RF output voltage through the directional coupler 120. The RF sampler 160 will typically include a line generator for generating harmonics of the reference signal derived from the reference oscillator 124. These harmonics are mixed with the sample portion of the RF output voltage in order to generate a set of difference signals, i.e., mixer products, at various frequency multiples of 25 MHz. A low-pass filter 164 having a cut-off frequency of approximately 40 MHz allows only the difference signal at 25 MHz to be passed by the amplifier 168. As is illustrated by FIG. 4, the amplifier 168 is connected to a phase detector 172 at a first input 176 thereof. A second input 180 of the phase detector 172 is driven by a 25 MHz reference derived by dividing passing the 100 MHz reference signal through a divide-by-four circuit 184. The phase detector 172 then provides an error signal to low-frequency path and high-frequency path loop filters 190 and 194. The loop filters 190 and 194 serve to close low-frequency and high-frequency feedback paths $P_{low}$ and $P_{high}$, respectively, within the oscillator circuit 150.

As noted above, it is desired that the RF output signal generated by the oscillator circuit of the present invention embody the phase noise characteristics induced by the reference oscillator at RF output frequencies less than a crossover frequency. At frequencies above the crossover frequency the phase noise created by the YIG tuned oscillator becomes less than that arising due to injection of the phase noise of the reference source into the oscillator circuit. In order that the RF output signal exhibit the phase noise characteristics of the reference signal for phase noise at less than the crossover frequency, it is necessary that the RF signal energy produced by the reference be controlled by the error signal until the frequency of the error signal reaches the crossover frequency. As noted above, the maximum frequency to which the fine tuning coils of existing YIG tuned oscillators are capable of responding has generally been significantly less than the desired crossover frequency. Hence, conventional oscillator circuits have heretofore been precluded from exhibiting the phase noise characteristics of reference oscillators included therein when operating at frequencies higher than the fine-tuning range of YIG tuned oscillators.

Referring to FIG. 4, the incorporation of the phase modulator 112 at the output of the YIG tuned oscillator 108 enables the present invention to overcome this shortcoming of conventional oscillator circuits. Specifically, the phase modulator 112 effectively extends the frequency range over which the error signal produced by the phase detector 172 determines the content of the phase noise of the RF output signal. In this regard the high-frequency path filter 194 is realized such that the tuning signal supplied to the modulator 112 via the high-frequency feedback path $P_{high}$ becomes significantly attenuated at frequencies in excess of the crossover frequency. The low-frequency path filter 190 is designed to force the gain around the low-frequency feedback path $P_{low}$ to be sufficient to meet the sensitivity requirements of the YIG resonator fine tuning coil. In addition, the break point of the filter 190 will generally be selected such that the low-frequency path exhibits unity gain at the maximum tuning frequency (e.g. 300 kHz) of the YIG fine-tune coil. In this way the present invention enables exploitation of the decreased high-frequency phase noise of improved reference oscillators irrespective of the high-frequency tuning capability of existing YIG tuned oscillators.

Figure 5B:
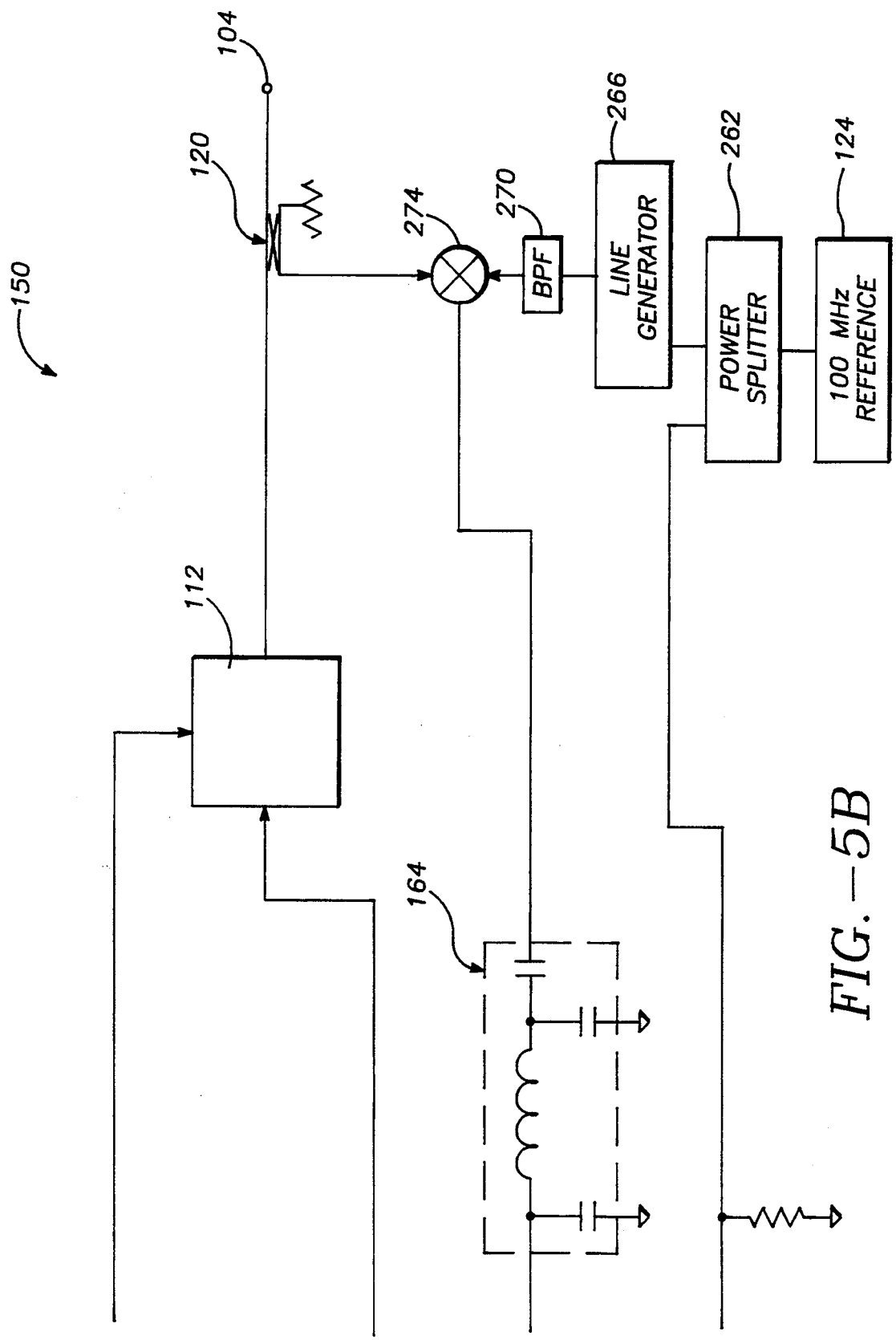
FIG. 5 shows a detailed schematic representation of a preferred embodiment of the oscillator circuit in which is included low-frequency and high-frequency feedback paths $P_{low}$ and $P_{high}$.

Referring to FIG. 5, there is shown a detailed schematic representation of the preferred embodiment of the oscillator circuit 150. As shown in FIG. 5, the coarse-tune YIG resonator coil driver 154 includes a comparator 250 connected to a current-driver transistor 254. The oscillation frequency of the coarse-tune coil of the YIG tuned oscillator 108 is proportional to the current supplied thereto by the transistor 254. The driver 154 operates to adjust the current through the coarse-tune coil such that the voltage across the sensing resistor 258 matches the external DC tuning voltage. In the implementation of FIG. 5 the sensitivity of the coarse-tune coil is approximately 20 MHz/volt. Thus, for example, if it is desired to cause the YIG tuned oscillator 108 to generate an RF signal at 2025 MHz, then the required driver current is 2025/20 mA, or 101.25 mA. If the value of the sensing resistor 258 is chosen to be 1 ohm, then the required tuning voltage would be 202.5 mV.

As shown in FIG. 5, the 100 MHz reference signal from the reference oscillator 124 is split by power splitter 262. One output port of the power splitter 262 is connected to harmonic line generator 266, while the other output port drives the divide-by-four circuit 184. The line generator 266 generates harmonics of the 100 MHz reference, which are subsequently filtered by a bandpass filter 270 having a passband extending from 2 to 3 GHz. The filtered harmonics are then mixed with the portion of the RF output signal supplied to a mixer 274 through the directional coupler 120. The mixer generates a plurality of signals at various frequencies equivalent to sums and differences of the frequencies of the RF output signal and the reference harmonics. One of these signals will have a frequency of approximately 25 MHz, and corresponds to the frequency difference between the selected RF output frequency and the nearest harmonic of the 100 MHz reference signal.

The low pass filter 164 will preferably have a cutoff frequency of approximately 40 MHz in order to extract the 25 MHz difference signal from the other signals produced by the mixer 274. Amplifier 168 amplifies the 25 MHz difference signal prior to it being applied to the phase detector 172 through the input 176.

Again referring to FIG. 5, the phase detector 172 includes a NAND gate 280, as well as first and second flip-flop comparators 284 and 288. Again, the 25 MHz reference signal from the divide-by-four circuit 184 is supplied to the phase detector 172 through second input port 180. In operation, when the frequency/phase of the difference signal driving input C of flip-flop 284 matches the frequency/phase of the 25 MHz reference signal supplied to the input C of flip-flop 288, the Q output of flip-flop 288 is set to a logic 1 and the Q BAR output of flip-flop 284 is set to a logic 0. If the phase of the difference signal begins to lead the phase of the 25 MHz reference signal, then the Q BAR output of the flip-flop 284 pulses to a logical 1. If the phase of the difference signal lags the reference signal, the Q output of flip-flop 288 transitions to a logical 0. In this way an error signal consisting of a high-frequency pulse stream is provided by the phase detector 172 to the low-frequency path and high-frequency path loop filters 190 and 194 through resistive network 292. The envelope defined by this pulse sequence will be of a frequency equivalent to the frequency of the phase noise at the RF output terminal 104.

In alternative embodiments the phase detector 172 may be implemented using commercially available integrated circuit phase detectors. For example, the AD9001 Ultrahigh Speed Phase/Frequency Discriminator, produced by Analog Devices, Inc., is capable of directly comparing the phase/frequency of input signals ranging in frequency from DC to approximately 200 MHz.

Figure 6:
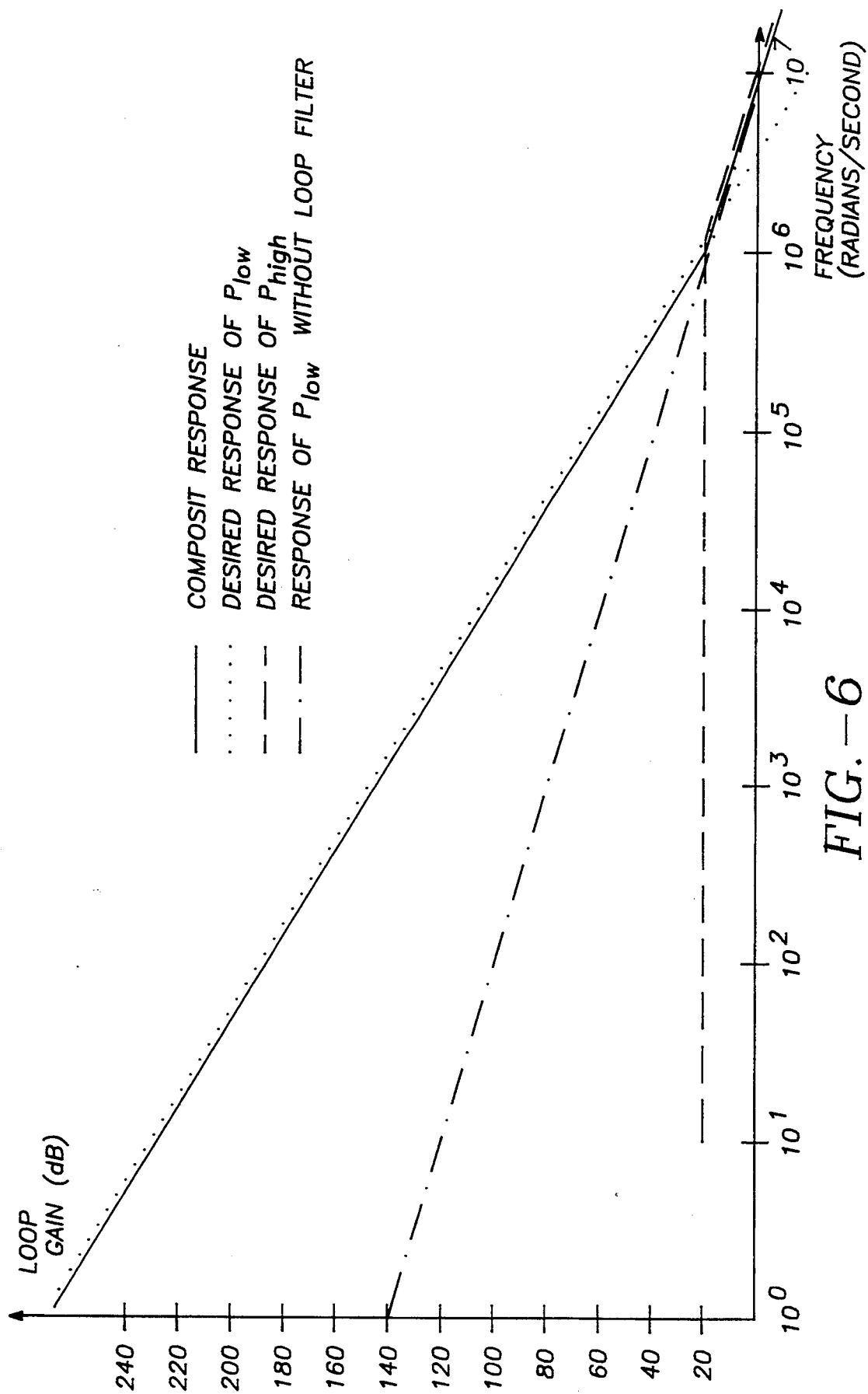
FIG. 6 shows a Bode plot of a feedback loop transfer characteristic to which reference is made in describing characteristics of the feedback paths $P_{low}$ and $P_{high}$.

FIG. 6 shows a Bode plot of a feedback loop transfer characteristic to which reference will be made in describing an exemplary implementation of the feedback paths $P_{low}$ and $P_{high}$ of the oscillator circuit 150. In what follows it will be assumed the phase noise of the reference oscillator is less than the phase noise of the YIG tuned oscillator for frequencies up to a crossover frequency of about $10^7$ radians/second ($\approx 1.59$ MHz) relative to the carrier (see FIG. 2). In this regard the solid line in FIG. 6 corresponds to a second-order loop transfer characteristic, i.e. 40 dB/decade roll-off, resulting in a crossover frequency of approximately 1.59 MHz. The desired response of the low-frequency path $P_{low}$ is indicated by the dotted line in FIG. 6, and is coincident with the second-order loop transfer characteristic for frequencies less than the break frequency of approximately 150 kHz. In addition, the dashed line of FIG. 6 depicts the desired response of the high-frequency path $P_{high}$, which is seen to dominate the overall loop gain for frequencies larger than the break frequency.

In order to determine the transfer characteristic of the low-frequency path loop filter 190 causing the low-frequency path $P_{low}$ to exhibit the response indicated by the dotted line in FIG. 6, it is necessary to first determine the DC gain of the path $P_{low}$ absent loop filter 190. Exemplary parameters for the components included in the low-frequency path $P_{low}$ are given below:

| Component Parameter | Parameter Value |
| --- | --- |
| Sensitivity of Phase Detector (172) | 0.8 Volts/radian |
| Sensitivity of Phase Modulator (112) | 1 radian/Volt |
| Sensitivity of YIG (108) fine-tune coil | 200 kHz/mA |
| Output resistance (296) of filter 190 | 50 ohms |

The specified output resistance 296 of the filter 190 corresponds to a transfer function of 20 mA/volt. Accordingly, the overall effective sensitivity of the YIG tuned oscillator 108 is equivalent to 200 K/Hz/mA × 20 mA/Volt, or 4 MHz/volt (2.5E7 radians/volt). Accordingly, the DC gain ($LG_{low}$) of the low-frequency path $P_{low}$ absent the gain contributed by loop filter 190 is:

$$LG_{low} = 0.8 \text{ Volt/radian} \times 2.5E7 \text{ radians/volt} = 2E7$$
$$= 20 \log 2E7 \text{ dB}$$
$$= 146 \text{ dB}$$

Since phase is the derivative of frequency, the circuit comprising the combination of the phase detector 172 and YIG tuned oscillator 108 will generally exhibit a gain roll-off of 20 dB/decade. This is evidenced by the transfer characteristic of the low-frequency path absent the loop filter 190, depicted by the line of alternating dots and dashes shown in FIG. 6., which is seen to have a slope of 20 dB/decade.

Although in the exemplary embodiment the break frequencies of the low-frequency and high-frequency paths were selected to be identical, the break point of the low-frequency filter 190 will generally be chosen to coincide with the frequency at which the gain of the YIG fine-tune coil begins to roll-off. In the preferred embodiment the YIG fine-tune coil has a tuning range of approximately 200 to 300 k/Hz relative to the carrier frequency. Accordingly, the low-frequency filter 190 is designed to have a break frequency of approximately 150 k/Hz (10E6 radians/second) in order to ensure sufficient attenuation of signals incident on the YIG fine-tune coil at frequencies in excess of 200 kHz.

In addition, the break point of the high-frequency filter 194 will typically be selected such that the cutoff frequency, i.e. frequency of 0 dB gain, of the filter 194 is equivalent to the crossover frequency at which the phase noise of the YIG tuned oscillator 108 becomes less than that induced by the reference source 124.

The low-frequency path filter 190 is designed such that the transfer characteristic of the low-frequency path $P_{low}$ is equivalent to the desired response (solid line of FIG. 6) for frequencies less than the indicated break frequency of 150 kHz. Referring to FIG. 5, the filter 190 includes an integrator 310 comprised of comparator 314 and feedback capacitor 318. The gain of the integrator 310 is equivalent to Xc/R1, where Xc is the reactance of capacitor 318 and R1 corresponds to the parallel combination of resistors 322 and 324. Assuming R1 is selected to be 500 ohms, Xc is required to be 250 ohms at the break frequency of 10E6 radians in order for a desired 6 dB of gain to exist in the low-frequency path. Hence, capacitor 318 is selected to have a value of 4000 pF.

A similar procedure is followed in designing the high-frequency path filter 194. The loop gain $LG_{high}$ of the high-frequency path $P_{high}$ absent the filter 194 may be expressed as the product of the sensitivities of the phase detector and the phase modulator, or:

$$LG_{high} = 0.8 \text{ Volts/radian} \times 1 \text{ radian/Volt}$$
$$= 20 \log 0.8 \text{ dB}$$
$$= -1.9 \text{ dB}$$

Referring to FIG. 6, the required gain of the high-frequency path $P_{high}$ at the break frequency of 10E6 radians is 20 dB. The filter 194 is thus designed to exhibit a gain of 11.9 dB, and to roll-off in gain at 20 dB/decade for frequencies in excess of the break frequency. In this way the overall loop gain is made to fall to 0 dB at the specified cutoff frequency of 10E7. As is described below, this is accomplished through an appropriate choice of component values within the filter 194.

Referring to FIG. 5, the filter 194 includes an integrator comprising a comparator 350, a feedback capacitor 354, and a feedback resistor 358. The filter 194 is driven by the phase detector 172 through the parallel combination of resistors 364 and 368, which in the exemplary embodiment presents an equivalent resistance of 500 ohms. Since the required gain of 21.9 dB is equivalent to a voltage gain of 12.4, the value of the feedback resistor 354 is equivalent to 500×12.4, or 6200 ohms. In order to achieve the required roll-off of 20 dB at the break frequency, the capacitive reactance of capacitor 354 at the break frequency must be equivalent to the magnitude of resistor 358. Hence, the value of capacitor 354 is equivalent to 1/(6200×10E6), or 161 pF.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A phase-locking oscillator circuit for providing an output signal at an output terminal, comprising:

tuned oscillator means for generating a carrier signal at a tunable carrier frequency, said tuned oscillator means having at least one tuned oscillator tuning port for receiving a tuned oscillator tuning signal;

a phase modulator having an input port to which is applied said carrier signal, a modulator control port for receiving a modulator control signal, and an output port for impressing said output signal upon said output terminal;

error detection means for comparing a predefined characteristic of said output signal to a reference signal and for generating an error signal on the basis of said comparison; and loop filter means for generating, in accordance with said error signal, said tuned oscillator tuning signal and said modulator control signal, for applying said tuned oscillator tuning signal to said at least one tuned oscillator tuning port, and for selectively applying said modulator control signal to said modulator control port, said loop filter means including means for attenuating said error signal when frequency of said error signal is greater than a predefined crossover frequency.

2. The phase-locking oscillator of claim 1 wherein said error detection means includes phase detector means for generating said error signal in response to phase difference between said RF output signal and said reference signal.

3. The phase locking oscillator of claim 2 further including a reference oscillator for generating said reference signal, said reference signal being of a predefined reference frequency.

4. The phase locking oscillator of claim 2 wherein said loop filter means includes a first loop filter operatively connected between said phase detector means and said tuned oscillator tuning port, and a second loop filter operatively connected between said phase detector means and said modulator control port, said second loop filter having a cutoff frequency related to said predefined crossover frequency.

5. The phase locking oscillator of claim 2 wherein said phase detector means includes an sampling circuit for generating a difference signal by comparing said output signal to a harmonic of said reference signal.

6. The phase locking oscillator of claim 5 wherein said phase detector means includes means for dividing said reference signal in order to form a divided reference signal at the frequency of said difference signal.

7. The phase locking oscillator of claim 6 wherein said phase detector means includes a phase detector for generating said error signal on the basis of phase difference between said divided reference signal and said difference signal.

8. The phase locking oscillator of claim 5 wherein said sampling circuit includes:
- a mixer for generating a plurality of mixing signals in response to said output signal and said harmonic of said reference signal; and
- a mixer filter for selectively passing at least one of said mixing signals to said phase detector, said difference signal corresponding to one of said mixing signals passed by said mixer filter.

9. In a phase locking oscillator a method of providing a phase-locked output signal at an output terminal, said method performed by said phase locking oscillator comprising the steps of:
- generating a carrier signal at a tunable carrier frequency;
- generating an error signal by comparing a predefined characteristic of said output signal to a reference signal;
- producing first and second tuning control signals based on said error signal, said second tuning control signal being produced by attenuating said error signal when frequency of said error signal exceeds a predefined crossover frequency;
- tuning said carrier frequency of said carrier signal on the basis of said first tuning control signal;
- selectively modulating phase of said carrier signal in accordance with said second tuning control signal in order to generate said output signal.

10. The method of claim 9 wherein said step of producing said first and second tuning control signals includes the step of generating an error signal by determining phase difference between said output signal and said reference signal.

11. The method of claim 10 wherein said step of producing said first and second tuning control signals includes the step of filtering said error signal.

12. The method of claim 11 wherein said step of filtering said error signal includes the steps of filtering said error signal in accordance with a low frequency path transfer characteristic so as to generate said first tuning control signal, and filtering said error signal in accordance with a high frequency path transfer characteristic so as to generate said second tuning control signal, said high frequency path transfer characteristic being related to said crossover frequency.

13. The method of claim 10 wherein said step of generating said error signal includes the steps of:
- generating at least one harmonic of said reference signal; and
- determining phase difference between said at least one harmonic of said reference signal and said output signal.

14. The method of claim 9 wherein said step of producing said first and second tuning control signals includes the steps of:
- generating at least one harmonic of said reference signal; generating a difference signal by determining phase difference between said at least one harmonic of said reference signal and said output signal, said difference signal being of a frequency substantially identical to the frequency difference between said output signal and said at least one harmonic of said reference signal; and
- filtering said difference signal.

15. The method of claim 14 wherein said step of producing said first and second tuning control signals includes the step of dividing said reference signal in order to form a divided reference signal of a frequency substantially identical to the frequency of said difference signal.

* * * * *